United States Patent
Matsubara et al.

(10) Patent No.: US 11,495,374 B2
(45) Date of Patent: Nov. 8, 2022

(54) RESISTIVE MATERIAL, RESISTOR, AND MANUFACTURING METHOD OF RESISTIVE MATERIAL

(71) Applicant: KOA Corporation

(72) Inventors: Shuhei Matsubara, Ina (JP); Keishi Nakamura, Ina (JP)

(73) Assignee: KOA Corporation, Nagano (JP)

( * ) Notice: Subject to any disclaimer, the term of this patent is extended or adjusted under 35 U.S.C. 154(b) by 0 days.

(21) Appl. No.: 17/263,988

(22) PCT Filed: Aug. 2, 2019

(86) PCT No.: PCT/JP2019/030505
§ 371 (c)(1),
(2) Date: Jan. 28, 2021

(87) PCT Pub. No.: WO2020/044957
PCT Pub. Date: Mar. 5, 2020

(65) Prior Publication Data
US 2021/0304925 A1    Sep. 30, 2021

(30) Foreign Application Priority Data

Aug. 29, 2018 (JP) .............................. JP2018-160251

(51) Int. Cl.
*H01C 1/14* (2006.01)
*G01R 15/14* (2006.01)
*G01R 19/00* (2006.01)
*H01C 17/00* (2006.01)

(52) U.S. Cl.
CPC ............. *H01C 1/14* (2013.01); *G01R 15/146* (2013.01); *G01R 19/0092* (2013.01); *H01C 17/00* (2013.01)

(58) Field of Classification Search
CPC ............. H01C 17/00; H01C 17/06553; G01R 15/146; G01R 19/0092
See application file for complete search history.

(56) References Cited

U.S. PATENT DOCUMENTS

| | | | | |
|---|---|---|---|---|
| 3,110,571 A * | 11/1963 | Alexander | ............... | H01B 1/02 428/564 |
| 4,923,829 A * | 5/1990 | Yasutomi | .......... | C04B 35/58071 501/95.3 |
| 5,085,806 A * | 2/1992 | Yasutomi | .......... | C04B 35/58007 252/520.2 |
| 8,839,659 B2 * | 9/2014 | Xiao | ..................... | B82Y 30/00 73/31.06 |
| 2014/0233200 A1 * | 8/2014 | Lemke | ................... | H05K 13/00 361/764 |

(Continued)

FOREIGN PATENT DOCUMENTS

| CN | 1495804 A | 5/2004 |
|---|---|---|
| CN | 104620333 A | 5/2015 |
| CN | 108154982 A | 6/2018 |

(Continued)

*Primary Examiner* — Kyung S Lee
(74) *Attorney, Agent, or Firm* — Honigman LLP (57) ABSTRACT

A resistive material for sensing current contains particles having an electrically insulating property and a metal body having a three-dimensional network enclosing the particles, and a ratio of the metal body to the whole of the resistive material is 30 vol % or more and 80 vol % or less.

6 Claims, 6 Drawing Sheets

(56) References Cited

U.S. PATENT DOCUMENTS

2016/0122877 A1* 5/2016 Wang .................... C23C 28/345
427/180

FOREIGN PATENT DOCUMENTS

| JP | H09260031 A | 10/1997 |
| JP | 2012-001402 A | 1/2012 |
| JP | 2017-019685 A | 1/2017 |

* cited by examiner

RESISTIVE MATERIAL, RESISTOR, AND MANUFACTURING METHOD OF RESISTIVE MATERIAL

CROSS-REFERENCE TO RELATED APPLICATIONS

This application is the U.S. national stage of PCT/JP2019/030505 filed on Aug. 2, 2019, which claims priority of Japanese Patent Application No. JP 2018-160251 filed on Aug. 29, 2018, the contents of which are incorporated herein.

TECHNICAL FIELD

The present disclosure relates to a resistive material and a resistor for sensing current, and a manufacturing method of the resistive material.

BACKGROUND ART

JP2017-019685A discloses a resistive material formed by adding flat-shaped metal particles at a predetermined proportion to an insulating material as a matrix material.

SUMMARY

With the resistive material as described above, because the matrix material is formed of the insulating material, although electrical resistance is high value, it is difficult to ensure flow paths for the current unless the metal particles are subjected to flattening process, and also a contacting state between the metal particles tends to be changed depending on the usage situation.

For example, there is a concern that the resistance value of the resistive material is changed by change in the contacting state due to temperature change in the resistive material and by occurrence of dielectric breakdown when high voltage is applied to the resistive material. As described above, with the resistive material in which the matrix material is constituted of the insulating material, the resistance characteristic tends to be unstable.

The present disclosure has been conceived in light of the above-described problem, and an object thereof is to provide a resistive material capable of achieving stabilization of a resistance characteristic, a resistor, and a manufacturing method of the resistive material.

According to one embodiment of the present disclosure, the resistive material for sensing current contains particles having an electrically insulating property and a metal body having a three-dimensional network enclosing the particles, and a ratio of the metal body contained in the resistive material is 30 vol % or more and 80 vol % or less.

According to this aspect, because the metal body constituting the resistive material has a three-dimensional network structure, conduction paths are formed within the resistive material with ease, and therefore, it is possible to stabilize the resistance characteristic of the resistive material.

DESCRIPTION OF EMBODIMENTS

An embodiment of the present disclosure will be described below with reference to the attached drawings.
Description of Resistor A structure of a resistor 1 in this embodiment will be described first with reference to FIG. 1A and FIG. 1B.

Figure 1A:
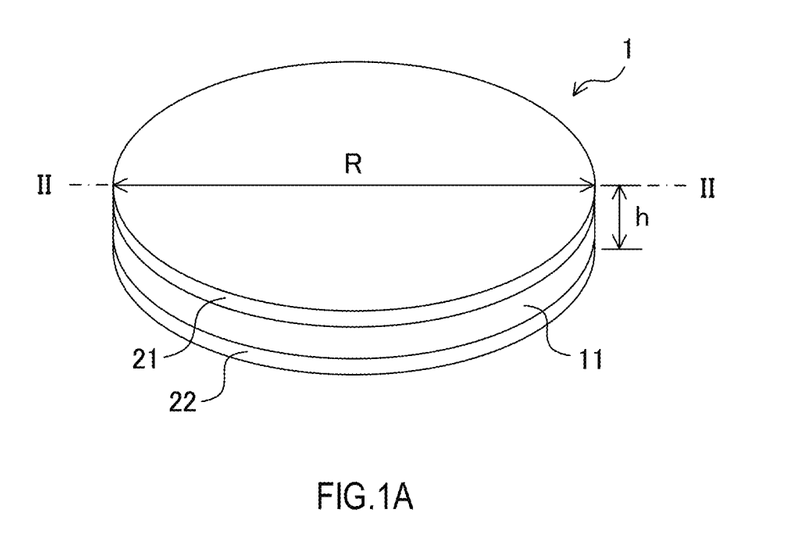
FIG. 1A is a diagram showing an example configuration of a resistor in an embodiment of the present disclosure.
Figure 1B:
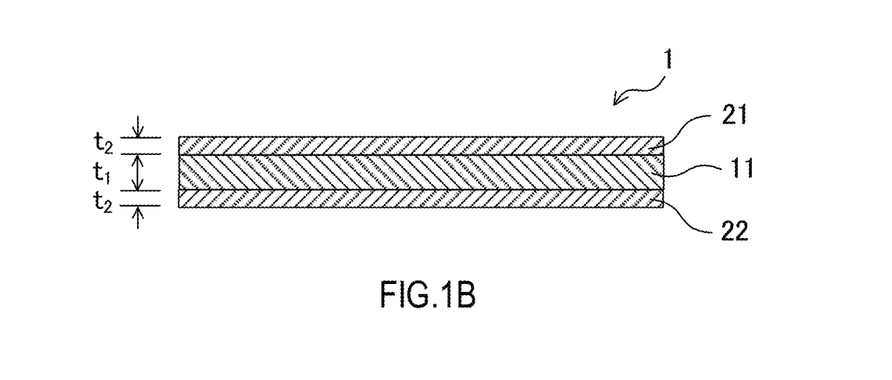
FIG. 1B is a sectional view taken along line II-II in FIG. 1A.

FIG. 1A is a perspective view showing a structure of the resistor 1 in this embodiment, and FIG. 1B is a sectional view of the resistor 1 taken along line II-II in FIG. 1A.

The resistor 1 is a resistor for sensing current and is referred to as, for example, a current sensing resistor or a shunt resistor. The resistor 1 is used for an application of sensing large current by being installed in a power module, for example.

In order to increase an accuracy in sensing of high-frequency current, the resistor 1 in this embodiment is formed to have a thin shape so as to reduce a self-inductance value of the resistor 1. The resistor 1 is formed to have a disc shape and is provided with a resistance body 11 that is constituted of a resistive material, and two electrode 21 and electrode 22 that sandwich the resistance body 11.

A thickness $t_1$ of the resistance body 11 is set to be smaller than several millimeters, for example, such that the self-inductance value of the resistor 1 is reduced. The thickness $t_1$ of the resistance body 11 in this embodiment is 0.2 mm. In addition, in order to facilitate implementation to a wiring pattern or implementation to a power semiconductor, a diameter R of the resistance body 11 is set to be several millimeters, for example, so as to be larger than the thickness $t_1$ of the resistance body 11. The diameter R of the resistance body 11 in this embodiment is 3 mm φ.

In this embodiment, because conduction paths serving as current paths through which current flows are formed in the thickness direction of the resistance body 11, the current paths are shorter than those in the general shunt resistor. Therefore, a specific resistance (volume resistance value) of the resistance body 11 is set to a higher value compared with a specific resistance of an alloy itself used as the resistive material for the general shunt resistor.

For example, in a case in which the resistor 1 is used for the application of sensing the large current, it is expected that the resistance value of the resistance body 11 to be set to a value within a range from 50 µΩ or more to 1,000 µΩ or less. Thus, as the resistive material constituting the resistance body 11, it is preferred to use the resistive material that can be designed such that the specific resistance (volume resistivity) falls within a range from 200 µΩ·cm (micro ohm centimeters) or more to 300,000 µΩ·cm or less.

The specific resistance of the resistance body constituting the general shunt resistor is within a range from 50 µΩ·cm or more to 100 µΩ·cm or less, and the resistive material of this embodiment is formed such that the specific resistance of the resistance body 11 becomes higher than the specific resistance of the resistance body of such a general shunt resistor.

The two electrodes 21 and 22 are electrodes for allowing the current to flow in the thickness direction of the resistance body 11 and are formed by using a metal material having a high electrically conductive property. The electrode 21 and the electrode 22 are respectively formed on both surfaces of the resistance body 11, and the electrode formed on the one surface of the resistance body 11 is referred to as a first electrode 21, and the electrode formed on the other surface thereof is referred to as a second electrode 22.

In order to make the resistor 1 to have a lower profile, each of the electrode 21 and the electrode 22 is formed so as to have, for example, a thickness $t_2$ thinner than the thickness $t_1$ of the resistance body 11. The thicknesses $t_2$ of the electrode 21 and the electrode 22 in this embodiment are both 0.1 mm.

As described above, with the resistor 1, because a height h of the resistor 1 is made low while ensuring a resistance value required to sense the current, the self-inductance value is made small. Therefore, it is possible to suppress a sensing error for the high-frequency current due to the self-inductance of the resistor 1.

Description of Resistive Material

A resistive material 11a is constituted by using insulating particles having the electrically insulating property and a metal body having the electrically conductive property such that the specific resistance of the resistance body 11 becomes higher than the specific resistance of the resistance body of the general shunt resistor. The metal body is formed to have a three-dimensional network enclosing the insulating particles. The resistive material 11a is formed of a sintered body formed by sintering a metal powder that is a powder of the metal for forming the metal body and the insulating particles.

As the metal powder before being subjected to the sintering, it is preferable to use particles having the aspect ratio ranging from 1.0 or more to 2.0 or less. In addition, the particles having the particle size ranging from 0.5 µm or more to 20 µm or less, may be used as the metal powder, and the particles having the particle size ranging from 0.1 µm or more to 10 µm or less, may be used as the insulating particles.

The metal body and the insulating particles constituting the resistive material 11a will be described.

Metal Body

The resistive material of the general shunt resistor may be used as the metal body for the resistive material 11a. From the view point of ensuring a stability of the resistance characteristic, the metal material suitable for the sensing of the large current, such as for example, the alloy with a small rate of change of the resistance value by the temperature change of the resistance body 11 is preferred.

Specific examples of the metal body include at least one alloy selected from the resistive materials, such as nichrome, Manganin®, Zeranin®, and copper-nickel. Especially, from the view point of ensuring the resistance value of the resistive material 11a, nichrome is preferably used. In addition, from the view point of ensuring processability, Manganin® is preferably used. As described above, it is preferable to form the metal body of the resistive material 11a by using at least one alloy selected from a group consisting of nichrome, copper-manganese, and copper-nickel.

Nichrome described above is Ni—Cr alloy or the alloy that contains the Ni—Cr alloy as the main component, copper-manganese is Cu—Mn alloy or the alloy that contains the Cu—Mn alloy as the main component, and copper-nickel is Cu—Ni alloy or the alloy that contains the Cu—Ni alloy as the main component. In the above, Manganin® is Cu—Mn—Ni alloy or the alloy that contains the Cu—Mn—Ni alloy as the main component, and Zeranin® is Cu—Mn—Sn alloy or the alloy that contains the Cu—Mn—Sn alloy as the main component.

In addition, the ratio of the metal body contained in the resistive material 11a is set so as to be 30 vol % or more and 80 vol % or less. If the percentage of the metal body is lower than 30 vol %, the current paths are not ensured in the resistive material 11a and the resistive material 11a no longer has functions as the resistive material. On the other hand, if the percentage of the metal body is higher than 80 vol %, the specific resistance of the resistive material 11a is lowered to the value substantially the same as that of the specific resistance of the metal body itself.

Insulating Particles

A ceramic material having a superior heat resistance in addition to the electrically insulating property may be used as the insulating particles of the resistive material 11a. For example, from the view point of suppressing formation of a crack in a joint portion due to thermal stress, the ceramic material includes at least one ceramic material selected from a group consisting of aluminum oxide ($Al_2O_3$), aluminum nitride (AlN), silicon nitride ($Si_3N_4$), and zirconia ($ZrO_2$). In the following, aluminum oxide is simply referred to as "alumina", and aluminum nitride is simply referred to as "aluminum nitride".

Among ceramic materials described above, from the view point of ensuring heat dissipation and heat cycle durability, it is preferred to use alumina that is widely used as an insulating material. In addition, for an application where higher heat dissipation is required, it is preferred to select aluminum nitride having higher heat conductivity, and for an application where high heat cycle durability is required, it is preferred to select silicon nitride.

Next, a method of manufacturing the resistor 1 will be described simply with reference to FIG. 2 and FIG. 3.

Figure 2:
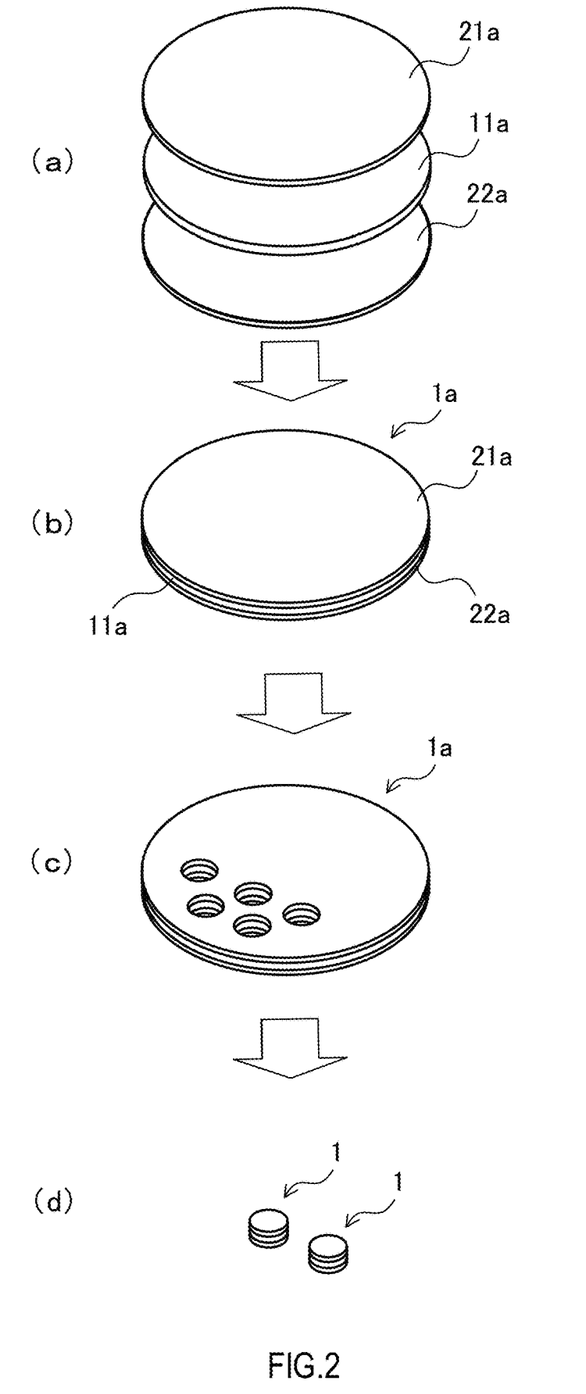
FIG. 2 is a diagram showing an example of a manufacturing method of the resistor.

FIG. 2 is a diagram for explaining an example of the manufacturing method of the resistor 1 in this embodiment.

The resistive material 11a having a disc shape and an electrode material 21a and an electrode material 22a respectively having a disc shape are first prepared. The electrode material 21a and the electrode material 22a are formed by using the metal material having a high electrically conductive property, such as copper (Cu) for example.

As shown in FIG. 2(a), the electrode material 21a, the resistive material 11a, and the electrode material 22a are stacked in this order. Thus stacked materials are then joined by using, for example, a pressure welding process, a sintering process, or the like, and thereby, a stacked structure 1a is formed as shown in FIG. 2(b).

Subsequently, as shown in FIG. 2(c), the stacked structure 1a is processed into individual pieces of the resistors 1 by punching it into circle shapes by using a processing such as a punching. By doing so, the disc-shaped resistors 1 are formed as shown in FIG. 2(d).

In this embodiment, although the resistor 1 is formed to have a disc shape, the resistor 1 may be formed to have a polygonal shape such as a triangle or rectangle. The manufacturing method for forming the resistor 1 having a rectangular plate shape will be described with reference to FIG. 3.

Figure 3:
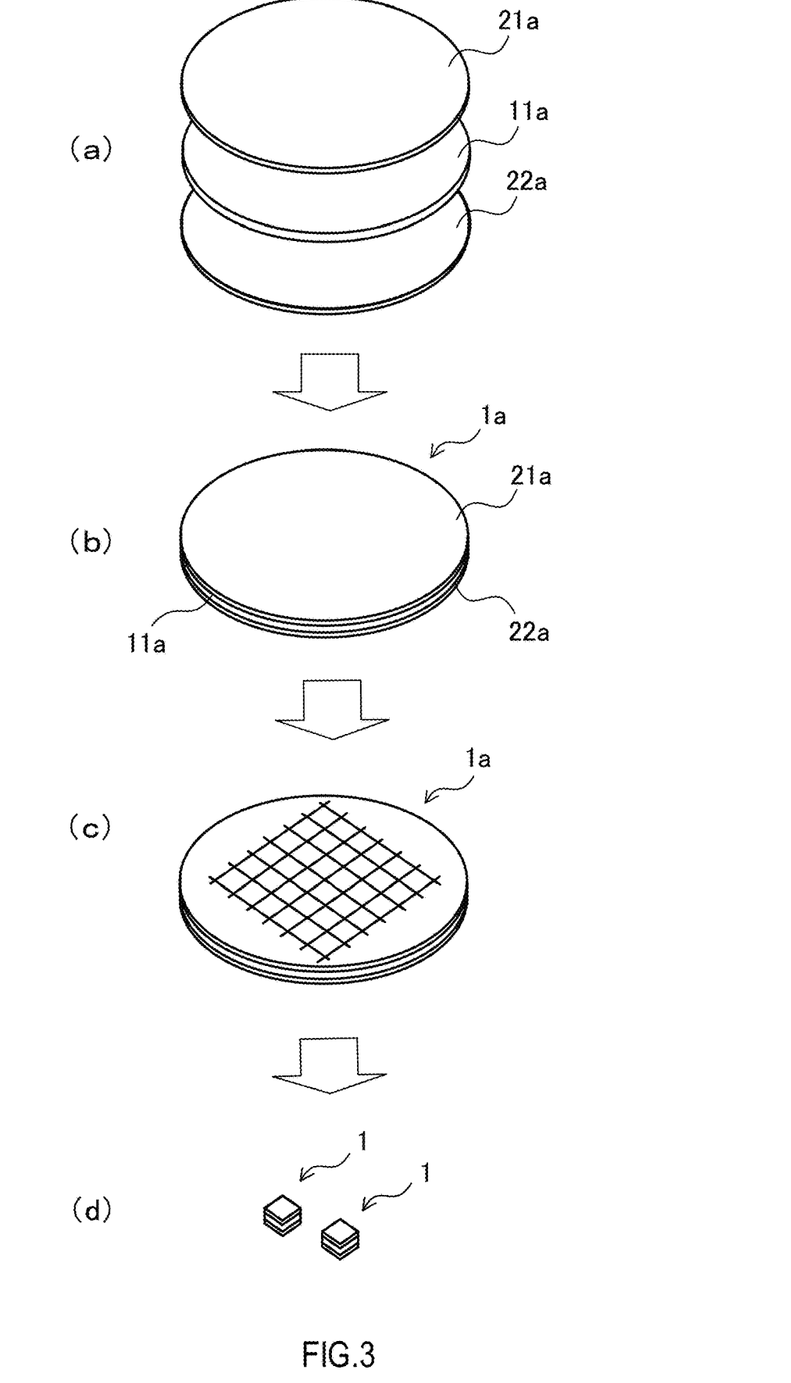
FIG. 3 is a diagram showing another example of the manufacturing method of the resistor.

FIG. 3 is a diagram for explaining another example of the manufacturing method of the resistor 1 in this embodiment. Steps shown in FIG. 3(a) to FIG. 3(b) are the same as the steps shown in FIG. 2(a) to FIG. 2(b).

After the stacked structure 1a is formed as shown in FIG. 3(a) and FIG. 3(b), the stacked structure 1a is processed into individual pieces of the resistors 1 by cutting it into rectangular shapes by using a processing such as dicing, as shown in FIG. 3(c). By doing so, the rectangular-plate-shaped resistors 1 are formed as shown in FIG. 3(d).

Next, a manufacturing method of the resistive material 11a in this embodiment will be described.

The manufacturing method of the resistive material 11a includes: a mixing step of mixing the metal powder having the electrically conductive property and an insulating powder that is a powder of the insulating material having the electrically insulating property; and a sintering step of sintering the mixed powder, which has been obtained by the mixing step" at a predetermined temperature while applying pressure by a uniaxial pressing.

In the mixing step, it is preferred that a powder of a metal having the melting point lower than the melting point of the insulating powder be used as the metal powder. And it is preferred to be granulated so that the particle size of the metal powder be equal to or smaller than the particle size of the insulating powder.

In the sintering step, for example, the mixed powder is subjected to the pressing by reducing the pressure inside a container receiving the mixed powder so as to approach a vacuum. As the pressing pressure is increased, the specific resistance of the resistive material 11a is lowered, however, the current paths in the resistive material 11a tend to be ensured with ease. Thus, the pressing pressure is preferred to be set at a higher value. In addition, the predetermined temperature during the sintering is set at temperature lower than the melting point of the metal powder, and it is preferable that the predetermined temperature be set at temperature lower than the melting point of the metal powder by about 15%.

By manufacturing the resistive material 11a as described above, the metal body is formed to have the three-dimensional network between the insulating particles of the resistive material 11a.

Next, effects and advantages of the resistive material 11a in this embodiment will be described.

According to this embodiment, the resistive material 11a for sensing current includes the insulating particles serving as particles having the electrically insulating property and the metal body having the three-dimensional network enclosing the insulating particles. The resistive material in which the ratio of the metal body to the whole of the resistive material is the range from 30 vol % or more to 80 vol % or less was formed.

As described above, because the insulating particles are contained in the resistive material 11a, the specific resistance of the resistive material 11a becomes higher compared with the specific resistance of the metal body itself. Furthermore, in the resistive material 11a, the metal body is formed to have the three-dimensional network so as to enclose the insulating particles. Therefore, it is considered that the mutual contact areas between the metal particles are ensured and that the degree of close contact between the metal particles is high. Thus, the resistance characteristic of the resistive material 11a tends to be stable.

In addition, even in the event of the temperature change in the resistive material 11a, the application of high voltage to the resistive material 11a, or the like, the current paths are less likely to be interrupted, and their influences on the specific resistance of the entire resistive material 11a can be suppressed. Therefore, it is possible to stabilize the resistance characteristic of the resistive material 11a while increasing the specific resistance of the resistive material 11a compared with the specific resistance of the metal body itself.

In addition, in this embodiment, the metal body having the electrically conductive property in the resistive material 11a is formed by using a metal powder formed of at least one metal selected from a group consisting of nichrome, copper-manganese, and copper-nickel. The metal powder is formed of the alloy that is used for current sensing and shows a small variation in the resistance value with the temperature change. Thus, by using the above-described alloys for the resistive material 11a, it becomes easy to ensure the resistance value required for the current sensing, and at the same time, to suppress the increase in a temperature coefficient of resistance that represents a degree of variation of the resistance value caused by the change in the temperature. In the shunt resistor, there is a trend in which the larger the temperature coefficient of resistance is, the larger the sensing error of the current becomes.

Furthermore, according to this embodiment, the insulating particles constituting the resistive material 11a are formed by using the insulating powder formed of at least one selected from a group consisting of alumina, aluminum nitride, silicon nitride, and zirconia. Because these insulating powders are formed of the ceramic material, have a low coefficient of thermal expansion, and are used as materials for substrate, by using these insulating powders, it is possible to make the thermal stress of the resistance body 11 formed of the resistive material 11a closer to the thermal stress of the substrate. Therefore, it is possible to suppress formation of the crack due to the heat cycle in the joint portion between the resistance body 11 and the substrate.

In addition, according to this embodiment, because the metal body in the resistive material 11a is formed to have the three-dimensional network, it is possible to make the above-described temperature coefficient of resistance to fall within the allowable range (i.e. equal to or lower than 100 ppm). Thus, it is possible to suppress decrease in a sensing accuracy during sensing of the current using the resistor 1.

Furthermore, it is possible to design the specific resistance of the resistive material 11a so as to fall within the range from 200 μΩ·cm or more to 30,000 μΩ·cm or less. Thus, even if the resistor 1 has a vertical-type resistor structure shown in FIG. 1, it is possible to ensure the resistance value required for sensing the current for the resistor 1 formed of the resistive material 11a.

In addition, according to this embodiment, the metal having the electrically conductive property is used in a form of the powder, and thus obtained metal powder and the insulating particles are sintered together to form the resistive material 11a. By forming the resistive material 11a as described above, it is possible to form the metal body in the resistive material 11a so as to have the three-dimensional network.

In addition, it is preferred that the aspect ratio of the metal powder before the sintering be 1.0 or more and 2.0 or less. By using the metal powder having such aspect ratio, the resistance value of the resistive material has an isotropy, and so, an orientation of the resistive material 11a need not be considered when the resistor 1 is formed. Thus, it is possible to process the resistive material 11a with ease.

In addition, according to this embodiment, the resistor 1 has: the resistance body 11 formed of the resistive material 11a containing the insulating particles in the metal body having the electrically conductive property; and the two electrodes 21 and 22 that sandwich the resistive material 11a. The metal body in the resistance body 11 is formed so as to be continuous in the direction between the electrode 21 and the electrode 22. With such a configuration, in the resistance body 11, many current paths are formed so as to avoid the insulating particles, and therefore, it is possible to achieve stabilization of the resistance characteristic of the resistance body 11 while increasing the specific resistance of the resistance body 11.

In addition, according to this embodiment, in the manufacturing method of the resistive material 11a, the insulating particles and the metal powder are mixed together, and thus obtained mixed powder is heated to the predetermined temperature that is lower than the melting point of the metal powder. At a state in which the mixed powder has reached the predetermined temperature, the mixed powder is sintered under pressure. By using such a manufacturing method, it is possible to form the metal body having the three-dimensional network enclosing the insulating particles in the resistance body 11.

Although the embodiment of the present disclosure has been described in the above, the above-mentioned embodiment merely illustrates a part of application examples of the present disclosure, and the technical scope of the present disclosure is not intended to be limited to the specific configurations of the above-described embodiment.

For example, although the areas and the thicknesses of the electrode 21 and the electrode 22 of the resistor 1 are equal to each other in the above-mentioned embodiment, the electrode 21 and the electrode 22 may be formed such that at least one of the areas and thicknesses is different from each other. In addition, a through hole may be formed in the electrode 21 and the electrode 22.

In addition, a method for forming the electrode 21 and the electrode 22 on the both surfaces of the resistive material 11a may includes a plating process, vacuum deposition process, ion plating process, sputtering process, vapor deposition process, cold spray process, or the like.

Example

Next, test specimens were prepared according to the resistive material 11a of this embodiment, and evaluations of the resistance characteristic as the resistive material 11a were performed by conducting various measurements. In the following, a preparation method of the test specimens and the evaluation thereof will be described.

Preparation of Test Specimens

As the insulating powder for preparing the resistive material 11a, a powder of alumina (ALM-41-01 from Sumitomo Chemical Company, Limited) was used. In addition, a powder of nichrome, more specifically, a powder (D50) having the particle size of 6 μm obtained by producing Evanome® by an atomization process was used as the metal powder for preparing the resistive material 11a. In addition, the test specimen formed solely of alumina and the test specimen formed solely of nichrome were prepared as comparative examples.

Mixing and Granulation

Both powders described above were first weighed according to mixing ratios shown in Table 1, and the both powders were mixed and granulated by using a mortar and a pestle until the both powders were mixed substantially homogeneously.

Average particle sizes of respective particles in thus granulated mixed powder are as follow:

Alumina Powder: 2.2 μm (average particle size)
Nichrome Powder: 2.0 μm (average particle size)

Pressurization and Sintering

Subsequently, the granulated mixed powder was transferred to a carbon die having a diameter of 10 mm φ. Then, hot-press furnace (Multi-purpose high temperature furnace Hi Multi® 5000 from Fuji Dempa Kogyo Co., Ltd.) was used to heat the mixed powder in the carbon die to the predetermined temperature lower than the melting point of nichrome, and the mixed powder was sintered under pressure in the heated state. The sintered test specimens were sintered bodies each having a disc shape with a diameter of 10 mm and the thickness of 1.8 mm.

Hot-pressing conditions were set as following:
Atmosphere: 20 Pa or lower
Pressing Pressure: 3.0 kN to 3.9 kN
Sintering Temperature: 1000° C. to 1200° C.
Holding Time: 10 min.

In the above-described preparation method, by changing the ratio between the alumina powder and the nichrome powder, a plurality of test specimens were prepared. For the hot-pressing conditions, the pressing pressure was changed for each of the mixed powders according to various ratios between the alumina powder and the nichrome powder as necessary.

Evaluation Method

Following evaluation tests were conducted for the test specimens obtained as described above.

Shape of Metal Powder Before Sintering

Calculation of the Aspect Ratio of the Metal Powder

An image of particles in the nichrome powder (nichrome particles) was acquired at a magnification of ×1,800 by using a scanning electron microscope (JSM-7000F from JEOL Ltd.), and the aspect ratios of the nichrome particles in the acquired image were calculated.

The aspect ratios of the nichrome particles were calculated by arbitrary selecting 20 particles from the nichrome particles in the acquired SEM image, and by dividing a length of a long side of the nichrome particle by a length of a short side of the nichrome particle for each of the nichrome particles selected.

Structure of Test Specimen

Images of cross-sections of the test specimens were acquired at a magnification of ×10,000 by using a focused ion/electron beam observation device (NB-5000 from Hitachi High-Technologies Corporation).

Resistance Characteristic

Calculation of the Specific Resistance

The resistance values of the test specimens when the temperature of the test specimens was 25° C. were measured, and the specific resistances were calculated on the basis of the resistance values.

Specific Resistance (μΩ·cm)=Resistance Value (Ω)×Area $(cm^2)$/Thickness (cm), wherein, the area of the test specimen is $0.25\pi$ $(cm^2)$, and the thickness of the test specimen is 0.18 (cm).

Measurement of Temperature Coefficient of Resistance

The Temperature Coefficient of Resistance (TCR) of the test specimen was measured. The temperature coefficient of resistance is an indicator expressing a rate of change in the resistance value due to the temperature change in the test specimen. The temperature coefficient of resistance is given by the following expression.

Temperature Coefficient of Resistance (ppm, ° C.)=(R−Ra)/Ra/(T−Ta)×1,000,000, wherein, Ta is a reference temperature, and Ra is the resistance value of the test specimen at the reference temperature Ta. T is a temperature at which a steady state is established, and R is the resistance value of the test specimen at the steady state T.

Thermal Characteristic

Measurement of Linear Expansion Coefficient

Linear expansion coefficients of the specific test specimens among a plurality of test specimens were measured. The linear expansion coefficient is an indicator expressing a rate of expansion of the length/volume of the test specimen per unit temperature due to the increase in the temperature of the test specimen.

Evaluation Result

Evaluation results for the resistance body structure of the test specimen will be described.

Shape of Metal Powder

Figure 4:
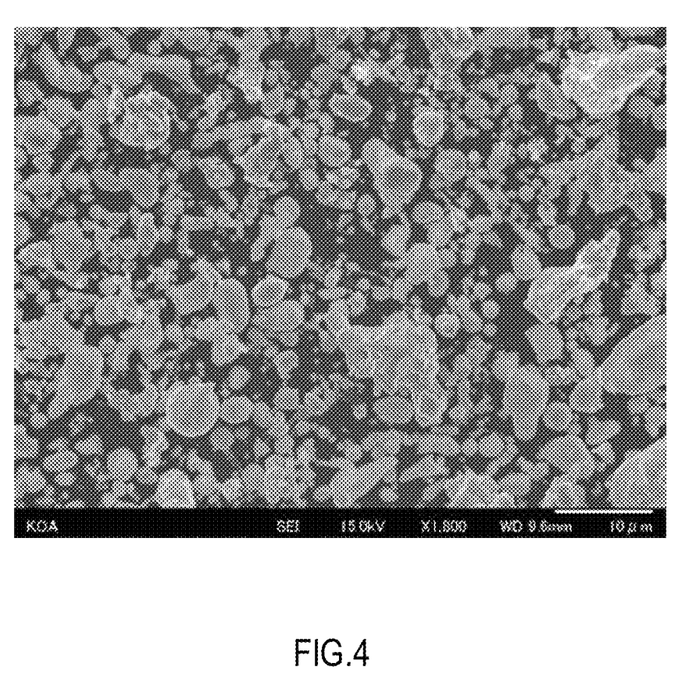
FIG. 4 is a diagram for explaining a shape of a metal powder for forming a resistive material.

FIG. 4 is a diagram showing an example of the SEM image of the granulated nichrome powder. As shown in FIG. 4, the particles of the nichrome powder had substantially spherical shape because the flattening process had not been performed. More specifically, the aspect ratio of the nichrome particles fell within a value range from 1.0 or more to 1.7 or less.

As described above, because the nichrome powder having the aspect ratio within a range from 1.0 or more to 2.0 or less, was used as the metal powder in the resistive material 11a, the alumina powder and the nichrome powder are mixed substantially homogeneously, and therefore, the alumina powder tends to be dispersed homogeneously in the test specimen.

Structure of Test Specimen

Figure 5:
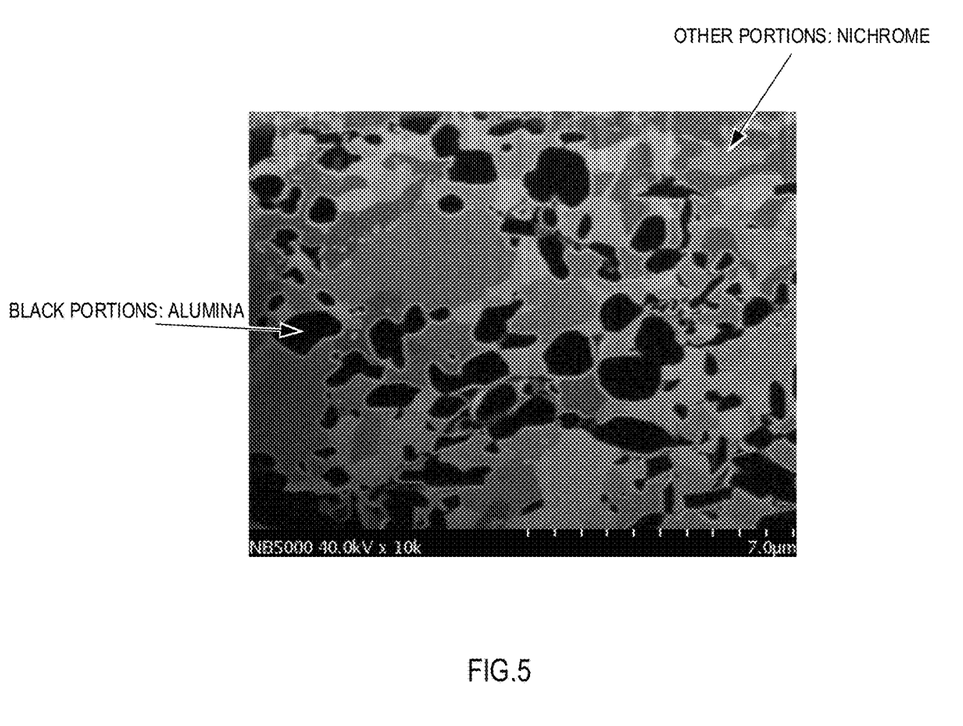
FIG. 5 is a diagram showing an example of a structure of the resistive material in this embodiment.
Figure 6:
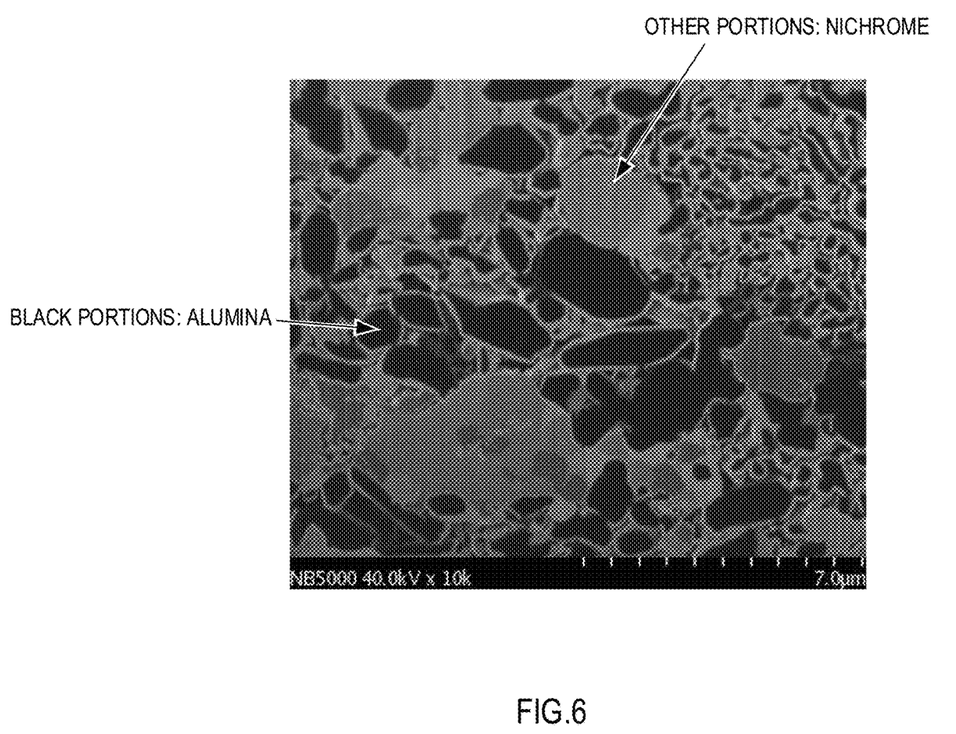
FIG. 6 is a diagram showing another example the structure of the resistive material in this embodiment.

FIG. 5 is a diagram showing the SEM image of the cross-section of the test specimen in which the ratio between the alumina powder and the nichrome powder is 50:50. FIG. 6 is a diagram showing the SEM image of the cross-section of the test specimen in which the ration between the alumina powder and the nichrome powder is 60:40.

In FIG. 5 and FIG. 6, black portions represent alumina particles (particles of the alumina powder), and other portions represent the powder of nichrome. In the other portions, color intensities are varied depending on differences in crystalline orientations of nichrome.

As shown in FIG. 5 and FIG. 6, the test specimen has a sea-island structure that is constituted of island portions containing the alumina particles serving as the insulating particles and a sea portion formed of the powder of nichrome serving as the metal body. It is thought that the sea-island structure is seen even if the test specimen is cut in any directions.

In other words, in the test specimen, a mesh network is formed by many nichrome particles that have been melted around the non-molten alumina particles and that have been linked three-dimensionally. Thus, the metal body formed by the nichrome particles linked in this manner is formed so as to surround at least a part of the surface of the alumina particles.

As described above, the test specimen based on the resistive material 11a is constituted of the particles having the electrically insulating property and the metal body having the three-dimensional network enclosing these particles. According to such a configuration, it is possible to ensure numerous current paths through which the current flows by the three-dimensional-network-shaped nichrome, while reducing an amount of current passing through per unit area by the alumina particles.

Contrary, when the resistive material using alumina as the matrix material is used, if the metal particles are not subjected to a flattening process, the current passages are not easily ensured, and in addition, mutual contact areas between the nichrome particles are reduced, and therefore, the contacting state tends to be poor. In general, at a part where the nichrome particles are in poor contact with each other, the contacting state may be changed due to the temperature change in the resistance body formed of the resistive material, or the application of the high voltage to the resistance body, and therefore, it may become a factor responsible for the change in the resistance value of the resistance body.

In contrast, in the resistive material 11a of this embodiment, because nichrome serving as the metal body is formed to have the three-dimensional network, the mutual contact areas between the nichrome particles are increased compared with the resistive material using alumina as the matrix material, and therefore, it is possible to reduce the part with poor contacting state. In addition, because the nichrome particles are linked together by being melted, the degree of close contact between the nichrome particles is increased, and so, it is possible to suppress occurrence of dielectric breakdown due to the application of the high voltage to the resistance body 11.

In the resistive material 11a, the insulating material (the alumina particles) is present in a state of particles as a filler without being melted. Thus, the resistive material 11a has the structure with which the dielectric breakdown due to the application of the high voltage and the high temperature is unlikely to be caused. In a case in which the matrix is formed by the insulating material, the insulating parts are non-uniformly formed, and therefore, the dielectric breakdown due to the high voltage is likely to be caused. On the other hand, with the resistive material 11a of this embodiment, because the metal body is formed around the insulating material so as to form the three-dimensional network, it is possible to stabilize the resistance characteristic of the resistive material 11a.

In addition, as shown in FIG. 6, even in a case in which a content of nichrome in the test specimen is reduced from 50 vol % to 40 vol %, although an occupancy of the alumina particles per unit area is increased, the three-dimensional network of the powder of nichrome is formed so as to enclose numerous alumina particles. Therefore, regardless of the content of nichrome, it is possible to stabilize the resistance characteristic of the resistive material 11a while increasing the specific resistance of the resistive material 11a. Even if the content of nichrome is reduced to 30 vol %, the three-dimensional network of nichrome is formed in a similar manner.

Resistance Characteristic/Thermal Characteristic

The resistance characteristic and the thermal characteristic of the test specimens are shown in Table 1 and Table 2.

TABLE 1

| | | | Test Specimen Number | | | | | | | | | |
|---|---|---|---|---|---|---|---|---|---|---|---|---|
| | | | T1 | T2 | T3 | T4 | T5 | T6 | T7 | T8 | T9 | T10 |
| Test Powder | Mixing Ratio | Alumina Powder (%) | 80 | 70 | 65 | 60 | 55 | 50 | 40 | 30 | 20 | 10 |
| | | Nichrome Powder (%) | 20 | 30 | 35 | 40 | 45 | 50 | 60 | 70 | 80 | 90 |
| Test Specimen Result | Nichrome Content (vol %) | | 20 | 30 | 35 | 40 | 45 | 50 | 60 | 70 | 80 | 90 |
| | Resistance Characteristic | Specific Resistance at 25° C. (μΩ · cm) | Insulative (Unmeasurable) | 24,090 | 7,280 | 2,990 | 1,470 | 710 | 490 | 290 | 200 | 160 |
| | | TCR (ppm) | Unmeasurable | 73 | 24 | 23 | 28 | 25 | 26 | 28 | 29 | 23 |

TABLE 2

|  |  | Test Specimen Number | | | | |
| --- | --- | --- | --- | --- | --- | --- |
|  |  | T2 | T3 | T4 | T5 | T6 |
| Test Specimen Result | Nichrome Content (vol %) | 30 | 35 | 40 | 45 | 50 |
| | Mixing Ratio Linear Expansion Coefficient ($\times 10^{-6}$/K) | 7.3 | 8.1 | 8.8 | 9.0 | 9.6 |

According to the results shown in Table 1, a test specimen T1 having the nichrome content of 20 vol % with respect to the entire test specimen was unable to ensure the current paths and had the resistance value much higher than that required as the resistive material, and thus, it showed properties almost as that of the insulating material. In addition, a test specimen T10 having the nichrome content of 90 vol % had a low specific resistance that is almost equal to that of nichrome itself.

Therefore, it is preferable that the content of nichrome in the resistive material 11a be the ratio of nichrome to the whole of the resistive material 11a is 30 vol % or more and 80 vol % or less. By changing the content of nichrome within such a range, it was possible to design the specific resistance so as to have values falling within the range from 200 µΩ·cm or more to 30,000 µΩ·cm or less, and at the same time, from the view point of ensuring the sensing accuracy of the current, it was possible to allow TCR to fall within the allowable range (i.e. equal to or lower than 100 ppm). In order to suppress TCR of the resistive material 11a to a lower value, it is preferred to design the content of nichrome so as to have values falling within the range from 35 vol % or more to 80 vol % or less.

In addition, according to the results shown in Table 1, it was found out that, as the content of nichrome was further reduced from 40 vol %, there was a tendency for the specific resistance to be increased abruptly and TCR to be also increased. The reason for this is assumed to be that when the current paths in the form of the three-dimensional network are narrowed or the number of the current paths are reduced in the test specimen, both of the specific resistance and TCR become more prone to be affected by the change in the mutual contacting state between the nichrome particles caused by the changes, such as the temperature change, the application of the current, or the like.

However, because the three-dimensional network of nichrome is formed, the current paths are ensured with ease compared with a case in which alumina is used as the matrix material, and therefore, the abrupt change in the resistance characteristic that is caused by the change in the content of nichrome is suppressed. Thus, even if the nichrome content is low, TCR falls within the range equal to or lower than 100 ppm. In addition, for the similar reasons, it is thought that individual differences among the resistive materials 11a are also suppressed.

According to the above-described results, it was found out that, as long as the content of nichrome with respect to the whole of the resistive material 11a is 30 vol % or more and 80% or less, the specific resistance of the resistive material 11a is increased relative to the specific resistance of nichrome itself, and the more stable resistance characteristic is achieved.

In the above-described embodiment, although nichrome is used as the metal body, even if at least one alloy selected from a group consisting of other copper-manganese and copper-nickel is used, it is possible to form the alloy having the three-dimensional network by using the similar manufacturing method. Also in this case, from the view point of ensuring the specific resistance that is higher than that of the alloy itself while maintaining the function as the resistance body, it is preferable that the content of the alloy to the resistive material is 30 vol % or more to 80% or less.

In addition, in the above-described embodiment, although alumina is used as the insulating particles, the present disclosure is not limited thereto, and it is thought that the similar resistance characteristic can be achieved even if at least one ceramic powder selected from a group consisting of, for example, aluminum nitride, silicon nitride, and zirconia is used.

In addition, in the above-mentioned embodiment, although only the alumina powder having the electrically insulating property is added to the nichrome powder having the electrically conductive property, other powders than the alumina powder for improving the resistance characteristic may be added. Even if the resistive material 11a is formed by adding the other powders in addition to the nichrome powder and the alumina powder, it is possible to form the nichrome particles having the three-dimensional network enclosing the alumina particles.

According to the results shown in Table 2, the linear expansion coefficients of the test specimens had values that fall within a range from the linear expansion coefficient of a test specimen T0 formed solely of alumina to the linear expansion coefficient of a test specimen T11 formed solely of nichrome, inclusive. According to the results, it was found out that, as the content of nichrome is reduced, the linear expansion coefficient of the test specimen approaches the linear expansion coefficient of the test specimen T0 formed solely of alumina.

As described above, by using the ceramic material, which is used for the substrate material, as the insulating particles of the resistive material 11a, it is possible to suppress the formation of the crack due to the heat cycle at the joint portion between the resistor 1 and the substrate.

The invention claimed is:

1. A resistive material for sensing current, the resistive material comprising:
    particles having an electrically insulating property and a metal body having a three-dimensional network enclosing the particles, so as to define a matrix material, wherein
    the metal body is formed of at least one selected from a group consisting of nichrome, copper-manganese, and copper-nickel,
    the resistive material is a sintered body obtained by sintering a metal powder and the particles,
    an aspect ratio of the particle of the metal powder is 1.0 or more and 2.0 or less, the aspect ratio defined by ((d-t)/d) wherein d is a length of a long side of the particle and t is a length of a short side of the particle, and
    a ratio of the metal body contained in the resistive material is 30 vol % or more and 80 vol % or less, and
    wherein the three-dimensional network is formed by the metal body that has been melted around the resistive materials.

2. The resistive material according to claim 1, wherein the particles are formed of at least one selected from a group consisting of alumina, aluminum nitride, silicon nitride, and zirconia.

3. The resistive material according to claim 1, wherein a temperature coefficient of resistance is equal to or lower than 100 ppm.

4. The resistive material according to claim 1, wherein a specific resistance is 200 µΩ·cm or more and 30000 µΩ·cm or less.

5. A resistor for sensing current, the resistor comprising:
a resistive material containing a metal body having an electrically conductive property and particles having an electrically insulating property, the metal body having a three-dimensional network enclosing the particles, wherein the three-dimensional network is formed by the metal body that has been melted around the particles so as to define a matrix, and wherein the metal body is formed of at least one selected from a group consisting of nichrome, copper-manganese, and copper-nickel, the resistive material is a sintered body obtained by sintering a metal powder and the particles, and an aspect ratio of the particle of the metal powder is 1.0 or more and 2.0 or less, the aspect ratio defined by ((d-t)/d) wherein d is a length of a long side of the particle and t is a length of a short side of the particle, and wherein a ratio of the metal body contained in the resistive material is 30 vol % or more and 80 vol % or less, and
two electrodes, the resistive material being sandwiched between the two electrodes, wherein
the metal body is formed so as to be continuous in the resistive material in a direction between the electrodes.

6. A manufacturing method of a resistive material comprising:
a step of mixing particles having an electrically insulating property and a metal powder having an electrically conductive property, wherein the metal powder forms a matrix;
the metal body is formed of at least one selected from a group consisting of nichrome, copper-manganese, and copper-nickel, the resistive material is a sintered body obtained by sintering a metal powder and the particles, an aspect ratio of the particle of the metal powder is 1.0 or more and 2.0 or less, the aspect ratio defined by ((d-t)/d) wherein d is a length of a long side of the particle and t is a length of a short side of the particle, and wherein a ratio of the metal body contained in the resistive material is 30 vol % or more and 80 vol % or less; and
a step of sintering a mixed powder obtained by the mixing step at a predetermined temperature lower than a melting point of the metal powder, the sintering being performed under pressure.

* * * * *